United States Patent
Jang

(10) Patent No.: US 6,894,946 B2
(45) Date of Patent: May 17, 2005

(54) METHODS OF OPERATING MEMORY SYSTEMS IN WHICH AN ACTIVE TERMINATION VALUE FOR A MEMORY DEVICE IS DETERMINED AT A LOW CLOCK FREQUENCY AND COMMANDS ARE APPLIED TO THE MEMORY DEVICE AT A HIGHER CLOCK FREQUENCY

(75) Inventor: Seong-Jin Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 10/377,374

(22) Filed: Feb. 28, 2003

(65) Prior Publication Data

US 2003/0235107 A1 Dec. 25, 2003

(30) Foreign Application Priority Data

Jun. 21, 2002 (KR) .................................. 10-2002-34813

(51) Int. Cl.[7] .......................... G11C 8/00; G11C 11/00; H03B 19/00; H03L 7/00; G06F 12/00
(52) U.S. Cl. ...................... 365/233; 365/148; 365/194; 365/198; 327/113; 327/145; 327/153; 711/167
(58) Field of Search ............................... 365/233, 148, 365/194, 198; 711/167; 327/113, 145, 153

(56) References Cited

U.S. PATENT DOCUMENTS

| | | | | | |
|---|---|---|---|---|---|
| 5,495,446 A | * | 2/1996 | Teel et al. | .................. | 365/200 |
| 5,635,852 A | * | 6/1997 | Wallace | ....................... | 326/30 |
| 6,330,627 B1 | * | 12/2001 | Toda | ......................... | 710/104 |
| 6,369,605 B1 | * | 4/2002 | Bonella et al. | ............... | 326/30 |
| 6,584,576 B1 | * | 6/2003 | Co | .............................. | 713/401 |
| 6,687,780 B1 | * | 2/2004 | Garlepp et al. | ............. | 710/305 |
| 6,754,132 B2 | * | 6/2004 | Kyung | ....................... | 365/233 |
| 2002/0108069 A1 | * | 8/2002 | Keeth et al. | ................ | 713/400 |
| 2002/0109528 A1 | * | 8/2002 | Toda | ........................... | 326/90 |
| 2002/0181633 A1 | * | 12/2002 | Trans | ......................... | 375/354 |
| 2002/0194416 A1 | * | 12/2002 | Kim et al. | .................. | 710/305 |
| 2003/0070052 A1 | * | 4/2003 | Lai | ............................. | 711/167 |
| 2003/0131138 A1 | * | 7/2003 | Allen et al. | ................. | 709/253 |

FOREIGN PATENT DOCUMENTS

| | | |
|---|---|---|
| JP | 06-044773 | 2/1994 |
| KR | 1999-0013963 | 2/1999 |

OTHER PUBLICATIONS

Notice to Submit Response issued Apr. 29, 2004 for Korean Application No. 10–2002–0012562.

* cited by examiner

*Primary Examiner*—David Nelms
*Assistant Examiner*—Ly Duy Pham
(74) *Attorney, Agent, or Firm*—Myers Bigel Sibley & Sajovec PA

(57) ABSTRACT

A memory system includes a memory device that includes an active termination circuit. The memory system further includes a controller circuit that includes a frequency control circuit that is configured to modulate a system clock between a first frequency value and a second frequency value, greater than the first frequency value, responsive to a control signal. The controller circuit is further configured to determine an active termination value for the active termination circuit responsive to the system clock at the first frequency value, and to apply commands to the memory device responsive to the system clock at the second frequency value.

10 Claims, 5 Drawing Sheets

METHODS OF OPERATING MEMORY SYSTEMS IN WHICH AN ACTIVE TERMINATION VALUE FOR A MEMORY DEVICE IS DETERMINED AT A LOW CLOCK FREQUENCY AND COMMANDS ARE APPLIED TO THE MEMORY DEVICE AT A HIGHER CLOCK FREQUENCY

RELATED APPLICATION

This application claims the benefit of Korean Patent Application No. 2002-34813, filed Jun. 21, 2002, the disclosure of which is hereby incorporated herein by reference.

FIELD OF THE INVENTION

The present invention relates generally to integrated circuit devices and methods of operating the same and, more particularly, to integrated circuit memory devices and methods of operating the same.

BACKGROUND OF THE INVENTION

In design and fabrication of systems, such as digital computers or communication/electronic apparatus, transmission lines associated with the systems may pose some concern. Signals transmitted through a transmission line may swing to a signal voltage deviating from a "high" or "low" level due to an unwanted effect, such as a signal reflection. The signal reflection may result from a mismatch between transmission line impedance and driver impedance and/or receiver impedance. A receiver that processes a signal may exhibit errors due to incorrect judgments made due to the signal reflection.

A termination may be used to enhance signal integrity and to increase operating bandwidth by reducing signal line reflection. FIG. 1 is a block diagram that illustrates a system 100 comprising a plurality of conventional termination devices 110a, 110b, 110c, 110d, and 110e (aggregately referred to as "devices 110") each embedding an active termination circuit. Each of the devices 110 comprises a transmission driver 112, a receiving driver 114, and an active termination circuit 120. The transmission driver 112 is controlled by a driver enable signal DRIVER_ENABLE and transmits a transmission signal DRIVER_SIGNAL to a bus 102. The receiving driver 114 is controlled by a receiver enable signal RECEIVER_ENABLE and receives a received signal RECEIVED_SIGNAL from the bus 102. The active termination circuit 120 comprises a switch 122 that is coupled between a termination voltage VTERM and a trimmable termination resistor 124 and is controlled by a termination enable signal TERMINATION_ENABLE.

The active termination circuit 120 typically comprises a relatively simple termination circuit so as to accomplish a fast switch-on/off. The active termination circuit 120 may be in a termination enable state or a termination disable state. The termination resistor 124 is trimmed through a predetermined calibration process so as to provide an optimal termination for the bus 102.

In a memory device comprising an active termination circuit (e.g., an SDRAM), a termination resistor 124 is trimmed during a power-up process and an initialization process. Power-up and initialization operations of a conventional SDRAM are illustrated in FIG. 2. As shown in FIG. 2, after the power supply voltages (e.g., VDD and VDDQ) are applied and all input signals are maintained in a stable state for at least 200 μs, differential system clocks CK and CKB are input. A series of predetermined commands, such as, a precharge all banks command, an extended mode register set (EMRS) command for enabling a delay locked loop (DLL), an MRS command for resetting the DLL, a precharge all banks command, first and second auto refresh commands, and a command for initializing a mode register are performed on rising edges of the system clock CK. The termination resistor 124 in the active termination circuit 120 shown in FIG. 1 is trimmed by the EMRS command during the power-up and initialization process.

During the power-up and initialization process, the system clocks CK and CKB are typically input with the same frequency as an operation frequency of the SDRAM. For example, if the operation frequency of the SDRAM is 500 MHz, a clock cycle (tCC) is 2 ns. In a case where a setup/hold timing margin is reduced, the EMRS command applied at 500 MHz may be regarded as an invalid command. If operations of the EMRS command terminate due to the command being invalid before an operation for setting an active termination value is complete, then the termination resistor 124 may be set to an inappropriate value, which may result in signal reflection in signals transmitted on the bus 102. As a result, the SDRAM may be unable to recognize or may misinterpret its commands.

SUMMARY OF THE INVENTION

According to embodiments of the present invention, a memory system comprises a memory device that comprises an active termination circuit. The memory system further comprises a controller circuit that comprises a frequency control circuit that is configured to modulate a system clock between a first frequency value and a second frequency value, greater than the first frequency value, responsive to a control signal. The controller circuit is further configured to determine an active termination value for the active termination circuit responsive to the system clock at the first frequency value, and to apply commands to the memory device responsive to the system clock at the second frequency value.

In other embodiments of the present invention, the controller circuit further comprises an extended mode register set (EMRS) control circuit that is configured to generate the EMRS control signal responsive to power up of the memory system.

The present invention may also be embodied as methods for operating a memory system. In some embodiments, the memory system is operated by applying power to the memory system. A system clock is generated that has a first frequency value. An active termination value for an active termination circuit embedded in a memory device of the memory system is determined responsive to the system clock at the first frequency value. The system clock frequency is increased to a second frequency value and commands are applied to the memory device responsive to the system clock at the second frequency value.

In some embodiments of the present invention, a delay locked loop (DLL) circuit is turned off responsive to the system clock at the first frequency value and a state of the active termination circuit is determined before determining the active termination value.

In further embodiments of the present invention, the DLL circuit is reset to an operational state in which the DLL circuit is locked responsive to the system clock at the first frequency value.

In still further embodiments, the active termination circuit is updated with the active termination value responsive to the system clock at the second frequency value.

In other embodiments, at least one memory bank in the memory device is precharged responsive to the system clock at the second frequency value.

In still other embodiments, a mode register set (MRS) is initialized responsive to the system clock at the second frequency value.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
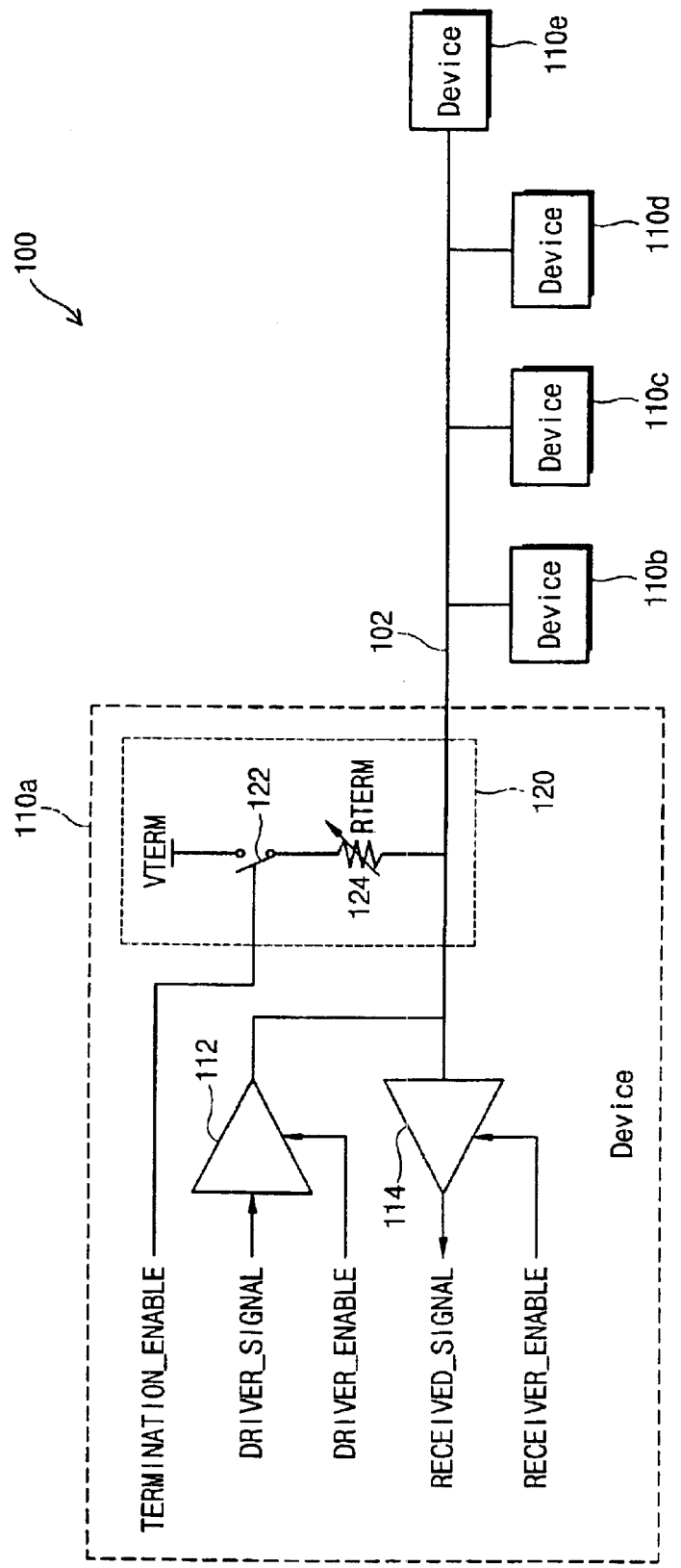
FIG. 1 is a block diagram that illustrates conventional termination devices.
Figure 2:
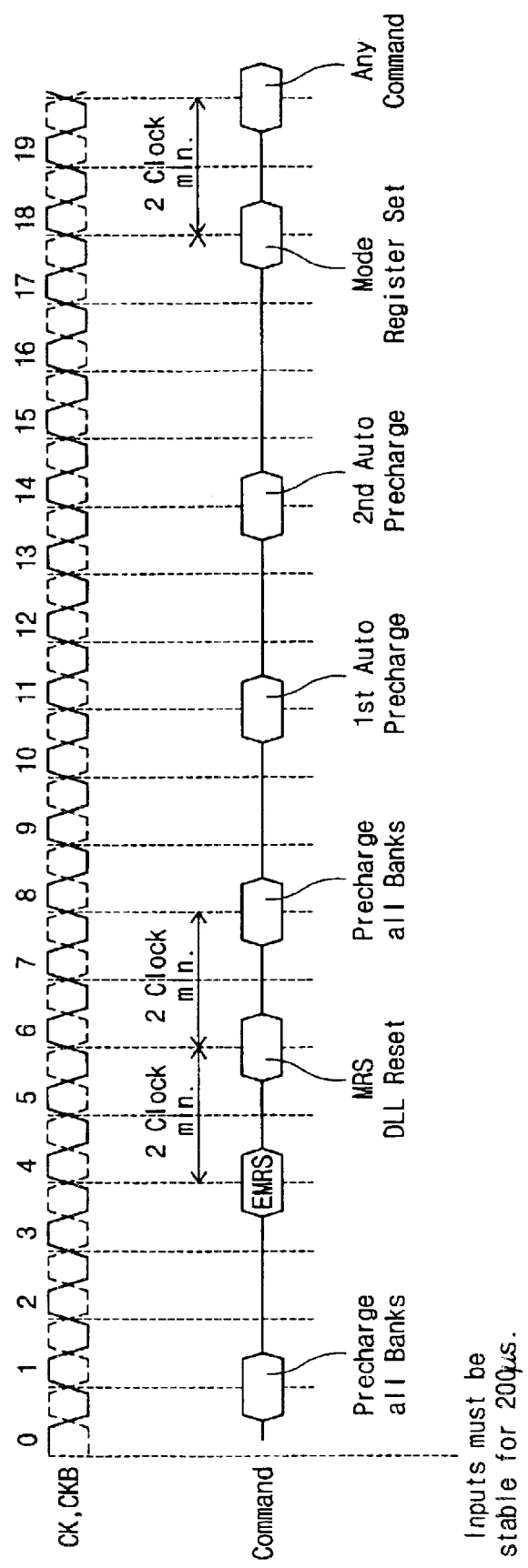
FIG. 2 is a timing diagram that illustrates power-up and initialization operations of a conventional SDRAM.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 3:
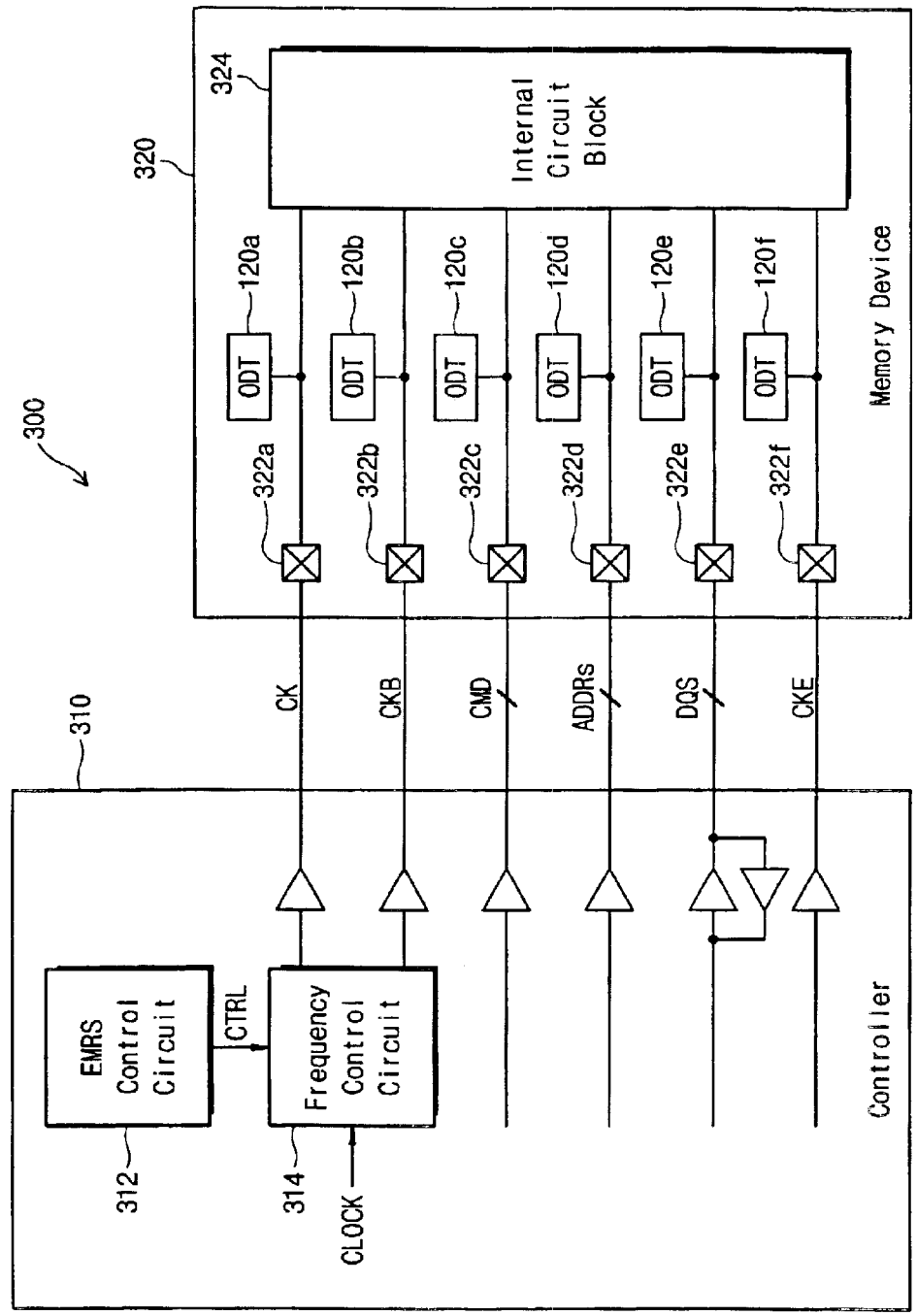
FIG. 3 is a block diagram that illustrates memory systems in accordance with some embodiments of the present invention.

Referring now FIG. 3, a memory system 300, according to some embodiments of the present invention, comprises a controller 310 and a memory device 320. The controller 310 comprises an extended mode register set (EMRS) control circuit 312 for generating a control signal CTRL and a frequency control circuit 314 for generating a system clock CLOCK as clock signals CK and CKB having a predetermined frequency in response to the control signal CTRL. The EMRS control circuit 312 may comprise stored program control logic so that the circuit operates automatically when power is applied to the memory system 300. In other embodiments, the EMRS control circuit 312 may operate manually.

Command signals CMD, address signals ADDRs, data input/output signals DQs, and a clock enable signal CKE are generated by the controller 310 and are provided to the memory device 320 together with the clocks CK and CKB. The signals CK, CKB, CMD, ADDRs, and DQs provided to the memory device 320 are input to pads 322a, 322b, 322c, 322d, 322e, and 322f, respectively. The pads 322a, 322b, 322d, 322e, and 322f are coupled to active termination circuits (or on die termination (ODT) circuits) 120a, 120b, 120c, 120d, 120e, and 120f (aggregately referred to as "an active termination circuit 120"), respectively. The active termination circuit 120 is similar to the active termination circuit 120 shown in FIG. 1. Active termination values of the pads 322a, 322b, 322c, 322d, 322e, and 322f are appropriately determined by internal control of the memory device 320 responsive to the EMRS command that is input to the controller 310 together with low-frequency clocks CK and CKB. Impedance matching of the signals CK, CKB, CMD, ADDRs, DQs, and CKE with a signal line may be achieved through the active termination circuit 120. The signals CK, CKB, CMD, ADDRs, DQs, and CKE are transmitted to an internal circuit block 324.

Figure 4:
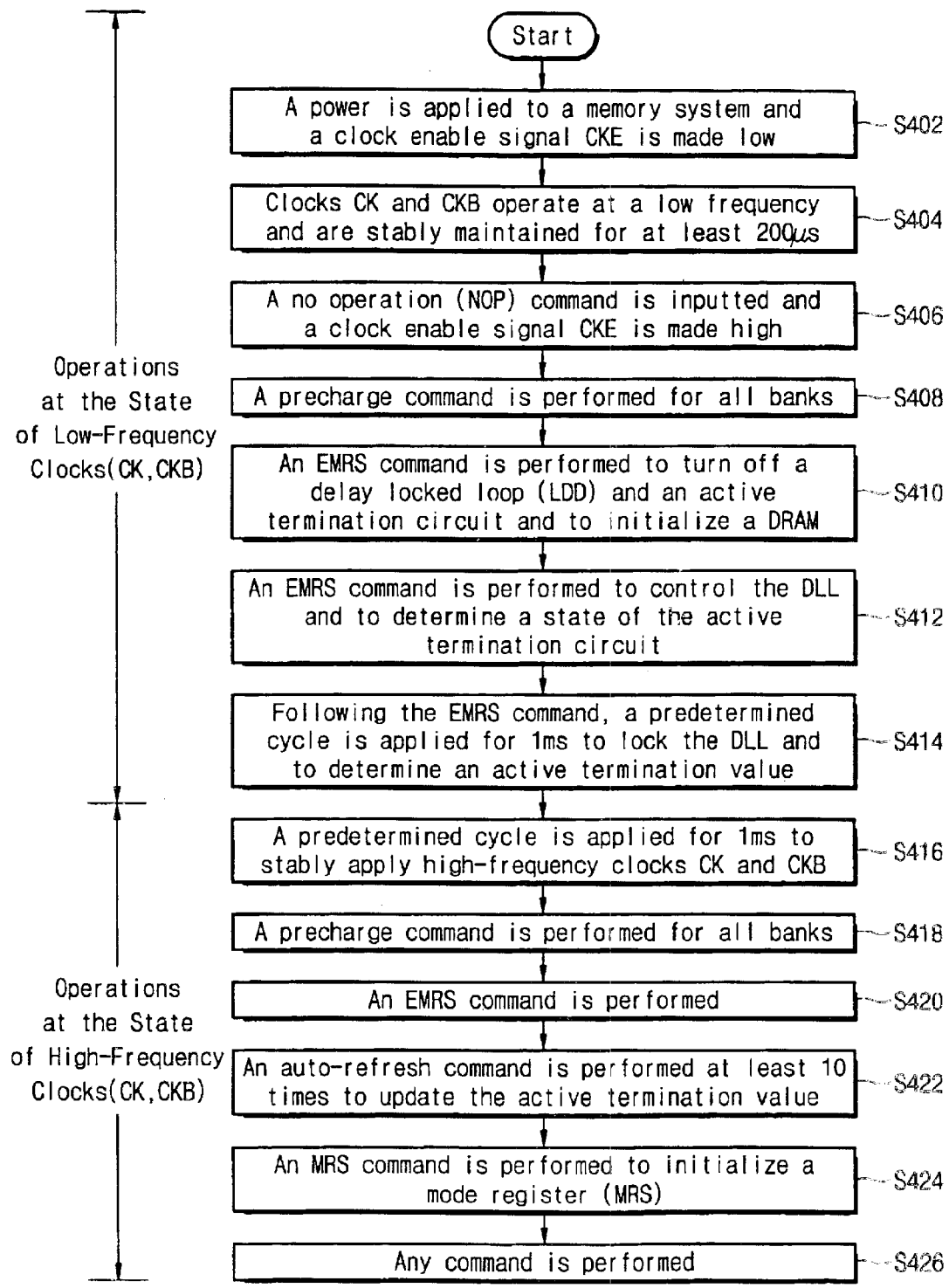
FIG. 4 is a flowchart that illustrates operations of memory systems in accordance with some embodiments of the present invention.
Figure 5:
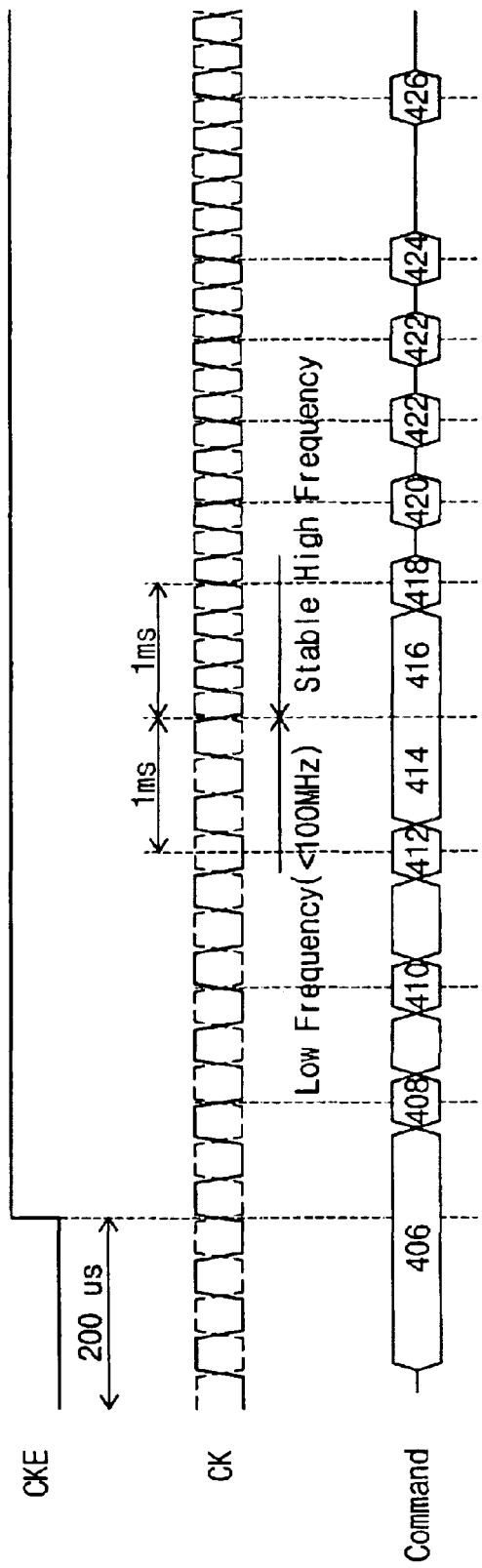
FIG. 5 is a timing diagram that illustrates operations of memory systems in accordance with some embodiments of the present invention.

Power-up and initialization of the memory system 300, in accordance with some embodiments of the present invention, will now be described with reference to FIG. 4 and FIG. 5. Referring now to FIG. 4, power is applied to the memory system 300 (see FIG. 3) and the clock enable signal CKE is driven low (step S402). Clocks CK and CKB operate at a relatively low frequency value and are maintained for a predetermined time, e.g., at least 200 μs (step S404). A No Operation (NOP) command is input and a clock enable signal CKE is driven high (step S406). A precharge command is performed for all banks in the memory device 320 (see FIG. 3) (step S408). An EMRS command is performed to turn off a delay locked loop (LDD), to disable the active termination circuit 120, and to initialize a memory device (DRAM) (step S410). An EMRS command is performed to control the DLL and to determine the state of the active termination circuit, e.g., termination enable state or disable state (step S412). Following the EMRS command, a predetermined cycle is applied for 1 μs to lock the DLL and to determine an active termination value (step S414). A predetermined cycle is performed for 1 μs to apply high-frequency clocks CK and CKB (step S416). A precharge command is performed for all banks (step S418). An EMRS command is performed (step S420). An auto-refresh command is performed at least 10 times to update the active termination value (step S422). And an MRS command is performed to initialize a mode register (MRS) (step S424). Any command for the memory device 320 may then be performed (step S426).

Steps S402–S414 are carried out while the clocks CK and CKB are at a generally low frequency, while steps S416–S426 are carried out while the clocks CK and CKB are at a generally high frequency. Unlike conventional memory systems, by applying an EMRS command while clocks CK and CKB are at a generally low frequency, an initial active termination value may be determined while setup/hold timing margins are secure. Accordingly, although the active termination value that exists before a new value is determined may not be appropriate, an EMRS command for active termination may nevertheless be regarded as a valid command. Thus, a complete setup of the active termination circuit may be achieved using the EMRS command. DLL operation is also controlled responsive to the clocks CK and CKB at a relatively low frequency. Accordingly, the DLL may be initialized in a generally stable and reliable manner. The timing diagram of FIG. 5 is based on the flowchart of FIG. 4.

Therefore, according to the present invention, an active termination value in a memory device and operation of a delay locked loop (DLL) may be controlled by setting frequencies of clocks CK and CKB to low frequencies during a power-up and initialization process of the memory system. Thus, a complete setup of an active termination circuit may be achieved and clocks based on the DLL may be reliably initialized. Afterwards, other commands may be performed in response to the clocks CK and CKB operating at a higher frequency. Moreover, the memory device may be less susceptible to errors resulting from signal reflection.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method of operating a memory system, comprising:
   applying power to the memory system;
   generating a system clock having a first frequency value;
   determining an active termination value for an active termination circuit embedded in a memory device of the memory system responsive to the system clock at the first frequency value;
   increasing the system clock frequency to a second frequency value; and
   applying commands to the memory device responsive to the system clock at the second frequency value.

2. The method of claim 1, further comprising performing the following before determining the active termination value:
   turning off a delay locked loop (DLL) circuit in the memory device, responsive to the system clock at the first frequency value; and
   determining a state of the active termination circuit.

3. The method of claim 2, further comprising:
   resetting the DLL circuit to an operational state in which the DLL circuit is locked responsive to the system clock at the first frequency value.

4. The method of claim 1, further comprising:
   updating the active termination circuit with the active termination value responsive to the system clock at the second frequency value.

5. The method of claim 4, further comprising:
   precharging at least one memory bank in the memory device responsive to the system clock at the second frequency value.

6. The method of claim 5, further comprising:
   initializing a mode register set (MRS) responsive to the system clock at the second frequency value.

7. A power-up and initialization method of a memory system, comprising:
   a first step of applying a power to a memory system;
   a second step of generating a low-frequency clock by a controller in the memory system;
   a third step of determining an active termination value embedded in a memory device of the memory system in response to the low-frequency clock;
   a fourth step of generating a high-frequency clock by the controller; and
   a fifth step of performing predetermined commands of the memory device in response to the high-frequency clock.

8. The power-up and initialization method of claim 7, wherein the second step is a step of dividing a system clock of the memory system in response to an EMRS control signal generated by an EMRS control circuit embedded in the controller and generating the clock.

9. The power-up and initialization method of claim 7, wherein the third step includes a step of controlling a delay locked loop (DLL) embedded in the memory device.

10. The power-up and initialization method of claim 7, wherein in the fourth step, a high-frequency clock cycle is supplied for a predetermined time so as to stabilize the high-frequency clock.

* * * * *